(12) United States Patent
Shih et al.

(10) Patent No.: US 11,735,540 B2
(45) Date of Patent: *Aug. 22, 2023

(54) APPARATUSES INCLUDING DUMMY DICE

(71) Applicant: Micron Technology, Inc., Boise, ID (US)

(72) Inventors: Shing-Yih Shih, New Taipei (TW); Neng-Tai Shih, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 271 days.

This patent is subject to a terminal disclaimer.

(21) Appl. No.: 17/177,431

(22) Filed: Feb. 17, 2021

(65) Prior Publication Data

US 2021/0175188 A1 Jun. 10, 2021

Related U.S. Application Data

(60) Continuation of application No. 16/540,444, filed on Aug. 14, 2019, now Pat. No. 10,937,749, which is a
(Continued)

(51) Int. Cl.
*H01L 23/00* (2006.01)
*H01L 21/683* (2006.01)
(Continued)

(52) U.S. Cl.
CPC .......... *H01L 24/02* (2013.01); *H01L 21/6835* (2013.01); *H01L 23/562* (2013.01); *H01L 24/97* (2013.01); *H01L 25/0655* (2013.01); *H01L 21/4857* (2013.01); *H01L 21/561* (2013.01); *H01L 21/568* (2013.01);
(Continued)

(58) Field of Classification Search
None
See application file for complete search history.

(56) References Cited

U.S. PATENT DOCUMENTS

| | | | |
|---|---|---|---|
| 6,713,850 B1 | 3/2004 | Yuan et al. | |
| 8,080,122 B2 * | 12/2011 | Sunohara | ............ H01L 21/6835 156/247 |

(Continued)

FOREIGN PATENT DOCUMENTS

| | | |
|---|---|---|
| CN | 102082102 A | 6/2011 |
| CN | 104733402 A | 6/2015 |
| JP | 2008-300390 A | 12/2008 |

OTHER PUBLICATIONS

Chinese Notice of Reexamination for Application No. 201510508330.6, dated Sep. 11, 2020, 12 pages.
(Continued)

*Primary Examiner* — Evren Seven
(74) *Attorney, Agent, or Firm* — TraskBritt

(57) ABSTRACT

A semiconductor device includes an interposer having a first side and a second side opposite to the first side, at least one active chip mounted on the first side within a chip mounting area through a plurality of first bumps, at least one dummy chip mounted on the first side within a peripheral area being adjacent to the chip mounting area, a molding compound disposed on the first side. The molding compound covers the at least one active chip and the at least one dummy chip. A plurality of solder bumps is mounted on the second side.

20 Claims, 7 Drawing Sheets

Related U.S. Application Data division of application No. 16/039,652, filed on Jul. 19, 2018, now Pat. No. 10,446,509, which is a continuation of application No. 14/730,231, filed on Jun. 3, 2015, now Pat. No. 10,043,769.

(51) Int. Cl.
  *H01L 25/065* (2023.01)
  *H01L 23/31* (2006.01)
  *H01L 21/56* (2006.01)
  *H01L 23/498* (2006.01)
  *H01L 21/48* (2006.01)
  *H01L 23/29* (2006.01)
  *H01L 25/00* (2006.01)

(52) U.S. Cl.
  CPC ........ *H01L 23/295* (2013.01); *H01L 23/3128* (2013.01); *H01L 23/49816* (2013.01); *H01L 23/49822* (2013.01); *H01L 24/16* (2013.01); *H01L 24/32* (2013.01); *H01L 24/81* (2013.01); *H01L 24/83* (2013.01); *H01L 24/92* (2013.01); *H01L 25/50* (2013.01); *H01L 2221/68345* (2013.01); *H01L 2221/68381* (2013.01); *H01L 2224/16227* (2013.01); *H01L 2224/32225* (2013.01); *H01L 2224/73204* (2013.01); *H01L 2224/81005* (2013.01); *H01L 2224/81192* (2013.01); *H01L 2224/81815* (2013.01); *H01L 2224/83005* (2013.01); *H01L 2224/92125* (2013.01); *H01L 2224/97* (2013.01); *H01L 2924/1432* (2013.01); *H01L 2924/1434* (2013.01); *H01L 2924/15192* (2013.01); *H01L 2924/15311* (2013.01); *H01L 2924/18161* (2013.01); *H01L 2924/351* (2013.01); *H01L 2924/3511* (2013.01)

(56) References Cited

U.S. PATENT DOCUMENTS

| | | | |
|---|---|---|---|
| 8,779,599 B2* | 7/2014 | Lin | H01L 21/561 257/725 |
| 9,224,697 B1* | 12/2015 | Kwon | H01L 24/94 |
| 9,449,953 B1 | 9/2016 | Shih et al. | |
| 9,607,967 B1* | 3/2017 | Shih | H01L 21/6835 |
| 9,613,931 B2* | 4/2017 | Lin | H01L 25/0652 |
| 9,922,964 B1 | 3/2018 | Chen et al. | |
| 10,431,517 B2 | 10/2019 | Wuu et al. | |
| 10,790,210 B2 | 9/2020 | Yu et al. | |
| 2002/0060084 A1 | 5/2002 | Hilton et al. | |
| 2002/0195625 A1 | 12/2002 | Hasegawa | |
| 2006/0249852 A1 | 11/2006 | Chiu et al. | |
| 2009/0008777 A1 | 1/2009 | Lin et al. | |
| 2009/0140442 A1 | 6/2009 | Lin | |
| 2009/0193374 A1 | 7/2009 | Fujimoto et al. | |
| 2009/0224401 A1 | 9/2009 | Fujii | |
| 2009/0236031 A1* | 9/2009 | Sunohara | H01L 23/5389 156/182 |
| 2009/0290316 A1 | 11/2009 | Kariya | |
| 2010/0038117 A1 | 2/2010 | Chung et al. | |
| 2011/0024916 A1* | 2/2011 | Marimuthu | H01L 24/24 257/E21.511 |
| 2011/0304016 A1 | 12/2011 | Nakamura et al. | |
| 2013/0105981 A1 | 5/2013 | Cooney et al. | |
| 2013/0112469 A1 | 5/2013 | Watanabe et al. | |
| 2013/0119539 A1 | 5/2013 | Hsiao et al. | |
| 2013/0175687 A1 | 7/2013 | Hu | |
| 2013/0241683 A1 | 9/2013 | Tsai et al. | |
| 2013/0249075 A1 | 9/2013 | Tateiwa et al. | |
| 2013/0252383 A1 | 9/2013 | Chen | |
| 2014/0252573 A1* | 9/2014 | Lin | H01L 23/5389 438/123 |
| 2014/0293529 A1 | 10/2014 | Nair et al. | |
| 2014/0353823 A1 | 12/2014 | Park et al. | |
| 2015/0061162 A1* | 3/2015 | Yu | H01L 24/97 438/107 |
| 2015/0093858 A1* | 4/2015 | Hwang | H01L 24/14 438/113 |
| 2015/0348877 A1* | 12/2015 | Huang | H01L 24/20 257/734 |
| 2015/0371965 A1 | 12/2015 | Hu | |
| 2016/0005695 A1 | 1/2016 | Tai et al. | |
| 2016/0027764 A1* | 1/2016 | Kim | H01L 25/105 257/686 |
| 2016/0071829 A1* | 3/2016 | Yu | H01L 23/58 257/773 |
| 2016/0276307 A1* | 9/2016 | Lin | H01L 23/562 |
| 2016/0322330 A1* | 11/2016 | Lin | H01L 25/0652 |
| 2016/0358865 A1 | 12/2016 | Shih et al. | |
| 2017/0047296 A1 | 2/2017 | Watanabe et al. | |
| 2019/0035752 A1 | 1/2019 | Chuang et al. | |
| 2019/0109119 A1 | 4/2019 | Shih et al. | |
| 2019/0237412 A1 | 8/2019 | Lee | |

OTHER PUBLICATIONS

Chinese Office Action and Search Report from Chinese Application No. 201510508330.6, dated Apr. 3, 2018, 14 pages with English translation.

Chinese Office Action and Supplementary Search Report from Chinese Application No. 201510508330.6, dated Jul. 25, 2019, 13 pages.

Chinese Office Action for Chinese Application No. 201510508330.6, dated Nov. 28, 2018, 11 pages.

Chinese Office Action from Chinese Application No. 201510508330.6, dated Mar. 28, 2019, 9 pages.

* cited by examiner

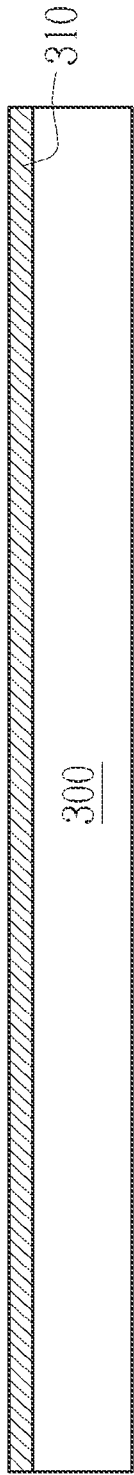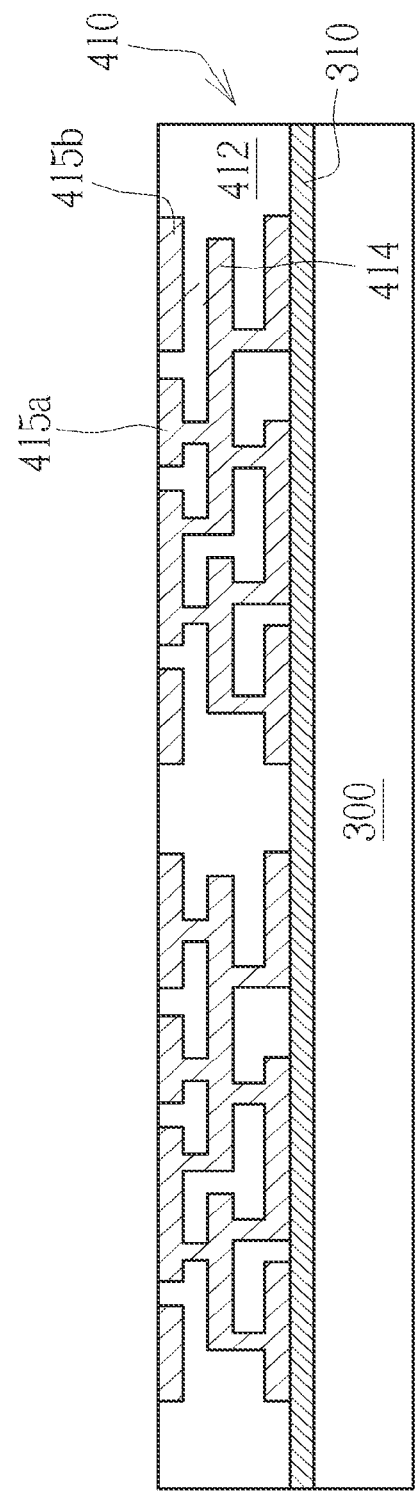
FIG. 1
FIG. 2

APPARATUSES INCLUDING DUMMY DICE

CROSS-REFERENCE TO RELATED APPLICATIONS

This application is a continuation of U.S. patent application Ser. No. 16/540,444, filed Aug. 14, 2019, now U.S. Pat. No. 10,937,749, issued Mar. 2, 2021, which is a divisional of U.S. patent application Ser. No. 16/039,652, filed Jul. 19, 2018, now U.S. Pat. No. 10,446,509, issued Oct. 15, 2019, which is a continuation of U.S. patent application Ser. No. 14/730,231, filed Jun. 3, 2015, now U.S. Pat. No. 10,043,769, issued Aug. 7, 2018, the disclosure of each of which is hereby incorporated herein in its entirety by this reference.

TECHNICAL FIELD

The present invention relates generally to the field of semiconductor packaging, and more particularly to a wafer-level package (WLP) with a substrate-less or TSV-less (TSV: Through Substrate Via) interposer and a method for manufacturing the same.

BACKGROUND

As known in the art, fan-out wafer-level packaging (FOWLP) is a packaging process in which contacts of a semiconductor die are redistributed over a larger area through a redistribution layer (RDL) that is typically formed on a substrate such as a TSV interposer.

The RDL is typically defined by the addition of metal and dielectric layers onto the surface of the wafer to re-route an Input/Output (I/O) layout into a looser pitch footprint. Such redistribution requires thin film polymers such as benzocyclobutene (BCB), polyimide (PI), or other organic polymers and metallization such as Al or Cu to reroute the peripheral pads to an area array configuration.

The TSV interposer is costly because fabricating the interposer substrate with TSVs is a complex process. Thus, forming FOWLP products that include an interposer having a TSV interposer may be undesirable for certain applications.

In wafer-level packaging, the wafer and dies mounted on the wafer are typically covered with a relatively thick layer of molding compound. The thick layer of the molding compound results in increased warping of the packaging due to coefficient of thermal expansion (CTE) mismatch, and the thickness of the packaging. It is known that wafer warpage continues to be a concern.

Warpage can prevent successful assembly of a die-to-wafer stack because of the inability to maintain the coupling of the die and wafer. Warpage issue is serious, especially in a large-sized wafer, and has raised an obstacle to a wafer-level semiconductor packaging process that requires a fine-pitch RDL process. Therefore, there remains a need in the art for an improved method of manufacturing wafer-level packages.

BRIEF SUMMARY

The present invention is directed to provide an improved semiconductor device and fabrication method that is capable of reducing the total used amount of molding compound on an interposer, thereby alleviating post-molding warpage.

In one aspect of the invention, a semiconductor device includes an interposer having a first side and a second side opposite to the first side; at least one active chip mounted on the first side within a chip mounting area through a plurality of first bumps; at least one dummy chip mounted on the first side within a peripheral area being adjacent to the chip mounting area; a molding compound disposed on the first side, the molding compound covering the at least one active chip and the at least one dummy chip; and a plurality of solder bumps mounted on the second side.

According to one embodiment of the invention, the dummy chip is mounted on the first side through a plurality of second bumps disposed on dummy pads within the peripheral area.

According to another embodiment of the invention, the dummy chip is mounted directly on the first side with an adhesive.

These and other objectives of the present invention will no doubt become obvious to those of ordinary skill in the art after reading the following detailed description of the preferred embodiments that are illustrated in the various drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIGS. 1 through 8 are schematic diagrams showing an exemplary method for fabricating a wafer-level package (WLP) with a substrate-less (or TSV-less) interposer according to one embodiment of the invention, wherein, FIGS. 1 through 7 are schematic, cross-sectional views of the intermediate product during the manufacturing process of the WLP;

FIG. 8 is a top view showing the exemplary layout of the active chips and dummy chips on the RDL.

DETAILED DESCRIPTION

Figure 3:
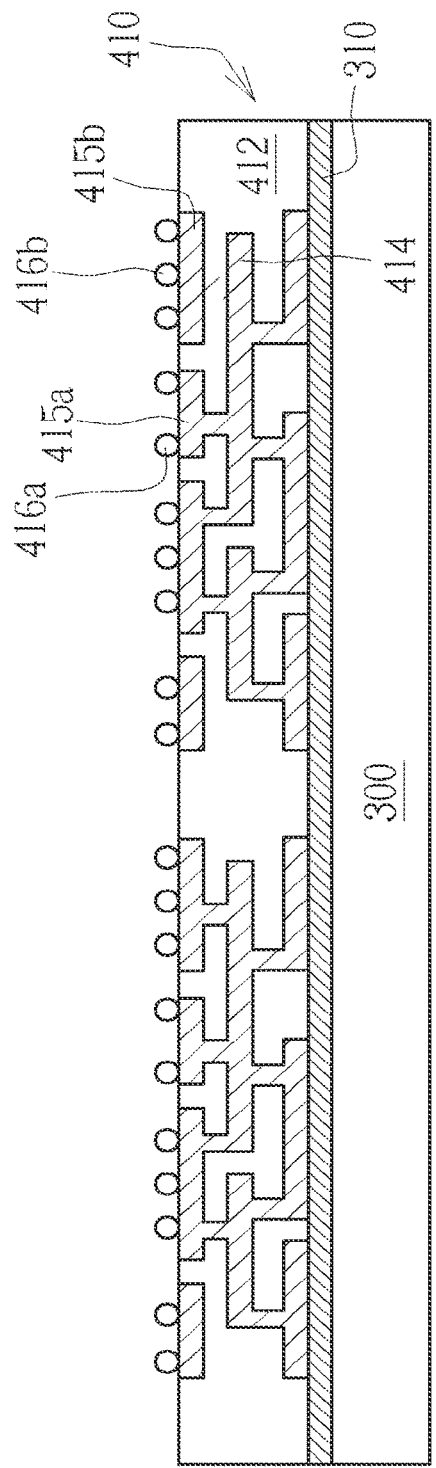

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments maybe utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale. The terms "die," "semiconductor chip," and "semiconductor die" are used interchangeably throughout the specification.

The terms "wafer" and "substrate" used herein include any structure having an exposed surface onto which a layer is deposited according to the present invention, for example, to form the circuit structure such as a redistribution layer (RDL). The term "substrate" is understood to include semiconductor wafers, but is not limited thereto. The term substrate is also used to refer to semiconductor structures during processing, and may include other layers that have been fabricated thereupon.

With reference to FIGS. 1 through 8, depicted are schematic diagrams showing an exemplary method for fabricating a wafer-level package (WLP) with a substrate-less (or TSV-less) interposer according to one embodiment of the invention.

As shown in FIG. 1, a carrier 300 is prepared. The carrier 300 may be a releasable substrate material with an adhesive layer (not explicitly shown). At least a dielectric layer or a passivation layer 310 is then formed on a top surface of the carrier 300. The passivation layer 310 may comprise organic materials such as polyimide (PI) or inorganic materials such as silicon nitride, silicon oxide, or the like.

As shown in FIG. 2, subsequently, a redistribution layer (RDL) 410 is formed on the passivation layer 310. The RDL 410 may comprise at least one dielectric layer 412 and at least one metal layer 414. The dielectric layer 412 may comprise organic materials such as polyimide (PI) or inorganic materials such as silicon nitride, silicon oxide, or the like, but not limited thereto. The metal layer 414 may comprise aluminum, copper, tungsten, titanium, titanium nitride, or the like.

According to the illustrated embodiment of FIG. 2, the metal layer 414 may comprise a plurality of bump pads 415a and dummy pads 415b exposed from a top surface of the dielectric layer 412. The bump pads 415a are disposed within a chip mounting area, while the dummy pads 415b are disposed outside the chip mounting area such as a peripheral area around the chip mounting area.

According to the illustrated embodiment of FIG. 2, the dummy pads 415b are isolated, inactive pads, which are not electrically connected to other circuitry in the RDL 410. In other words, no signal will pass through these dummy pads 415b during operation of the chip package.

As shown in FIG. 3, a plurality of bumps 416a and 416b, such as micro-bumps, may be formed on the RDL 410 for further connections. The bumps 416a may be directly formed on respective bump pads 415a in the metal layer 414. The bumps 416b may be directly formed on respective dummy pads 415b in the metal layer 414. In some embodiments, a passivation layer or a dielectric layer (not shown) may be formed on the RDL 410 before the formation of the bumps 416a and 416b.

Figure 4:
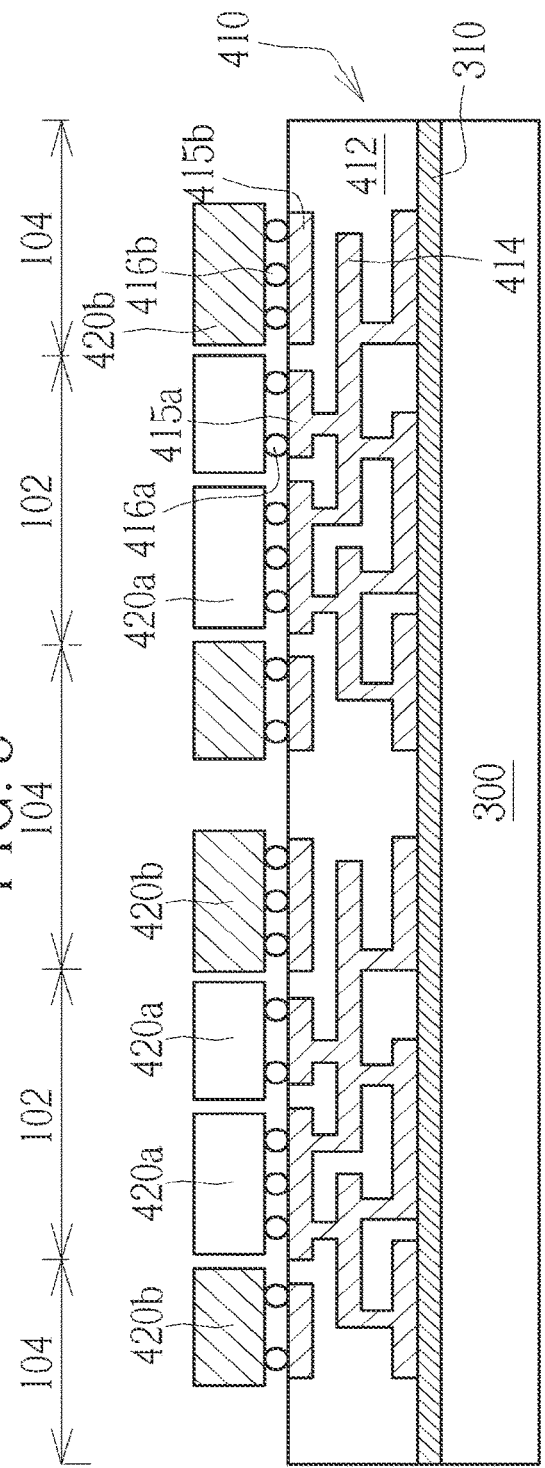

As shown in FIG. 4, after the formation of the bumps 416a and 416b, individual active chips 420a (e.g., flip-chips or dies) with their active sides facing down toward the RDL 410 are then mounted on the RDL 410 through the bumps 416a to thereby forming a stacked chip-to-wafer (C2W) construction. These individual flip-chips or dies 420a are active integrated circuit chips with certain functions, for example, GPU (graphics processing unit), CPU (central processing unit), memory chips, etc.

Figure 8:
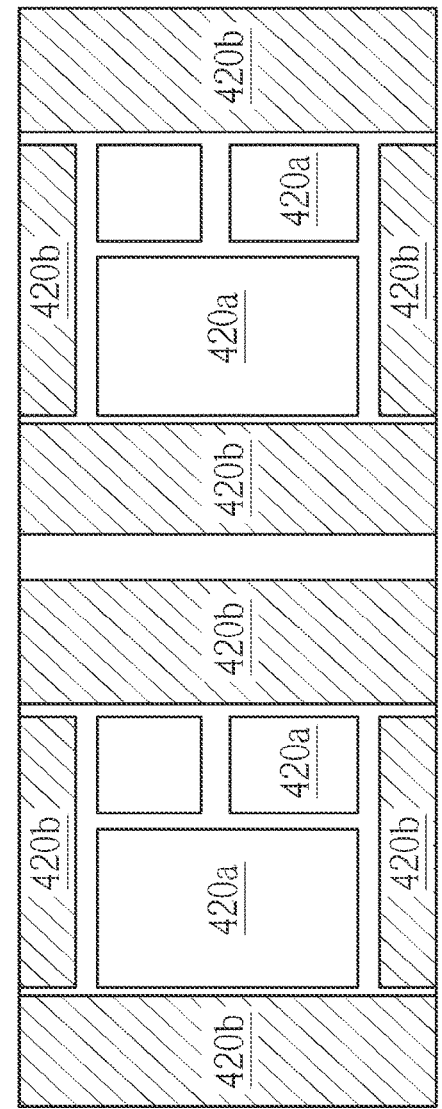

According to the illustrated embodiment, the dummy chips 420b are mounted in a peripheral area 104 around a chip mounting area 102 through the bumps 416b. FIG. 8 illustrates an example of the arrangement of the active chips 420a and the dummy chips 420b. For example, the dummy chips 420b may be dummy silicon chips, dies or pieces having dimensions or sizes similar to that of the chip 420a, but not limited thereto. It is to be understood that other materials such as metal, glass or ceramic may be used.

Optionally, an underfill (not shown) may be applied under each of the active chips 420a and the dummy chips 420b. Thereafter, a thermal process may be performed to reflow the bumps 416a and 416b.

Figure 5:
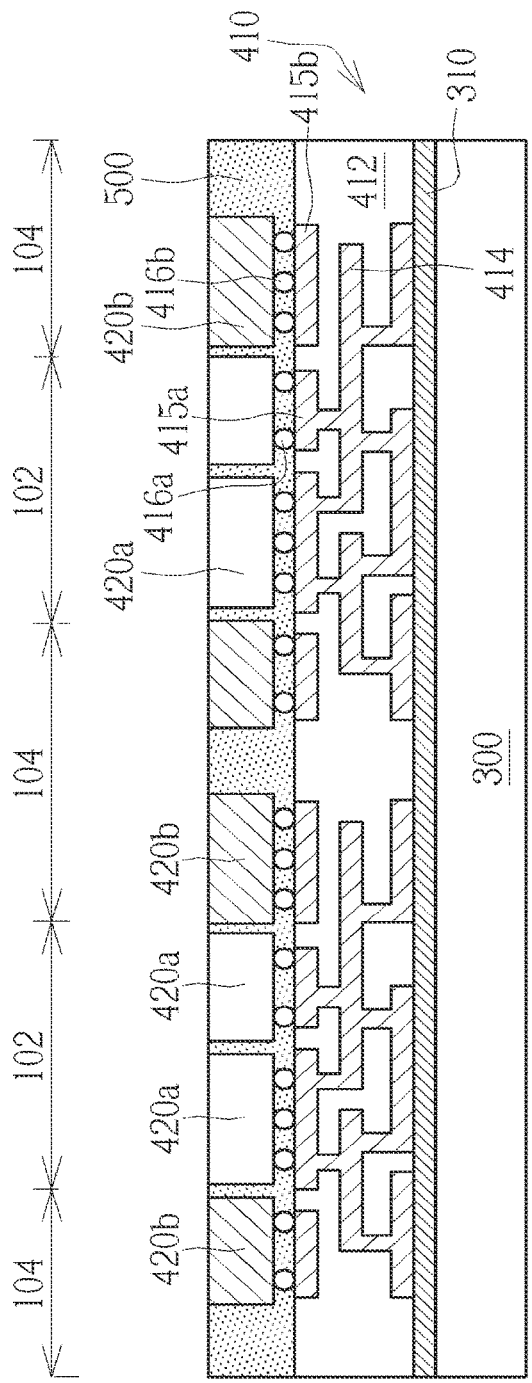

As shown in FIG. 5, after the die-bonding process, a molding compound 500 is applied. The molding compound 500 covers the attached active chips 420a and the dummy chips 420b and the top surface of the RDL 410. The molding compound 500 may be subjected to a curing process. The molding compound 500 may comprise a mixture of epoxy and silica fillers, but is not limited thereto.

Optionally, a top portion of the molding compound 500 may be polished away to expose a top surfaces of the active chips 420a and the dummy chips 420b.

Since most of the peripheral area around the chip mounting area is occupied by the dummy chips 420b, the used amount of the molding compound 500 is reduced, and therefore the warpage of the substrate or wafer is alleviated or avoided. According to the illustrated embodiment, these dummy chips 420b may also be referred to as "warpage-control" dummy chips.

Figure 6:
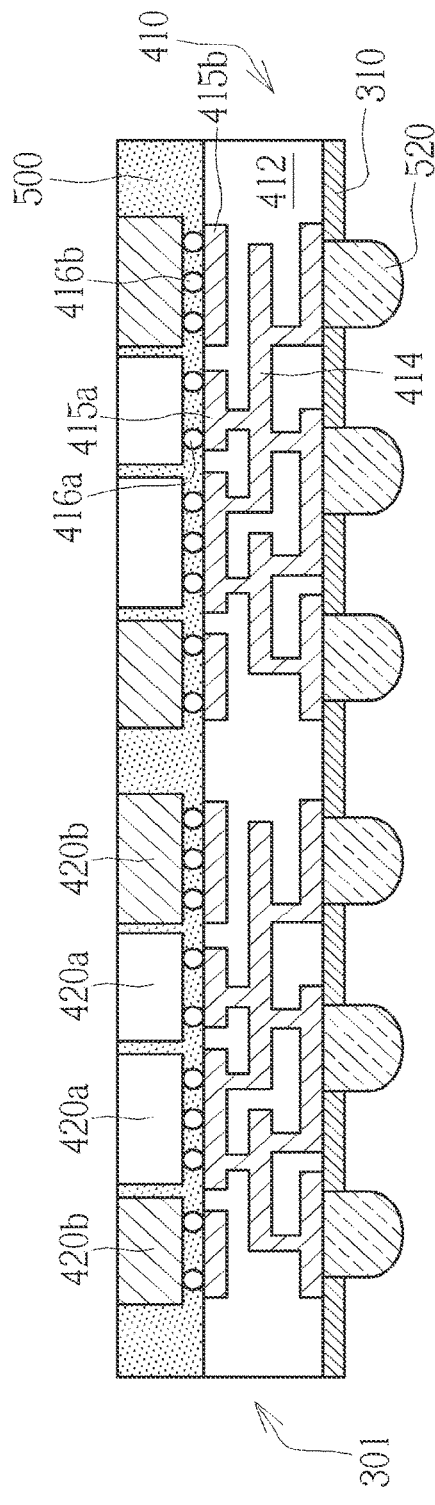

As shown in FIG. 6, after the formation of the molding compound 500, the carrier 300 is removed or peeled off to expose the passivation layer 310, thereby forming a TSV-less interposer 301. The de-bonding of the carrier 300 may be performed by using a laser process or UV irradiation process, but not limited thereto.

To peel off the carrier 300, another temporary carrier substrate (not shown) may be attached to the molding compound 500. After the de-bonding of the carrier 300, openings may be formed in the passivation layer 310 to expose respective solder pads, and then solder bumps or solder balls 520 maybe formed on the respective solder pads.

Figure 7:
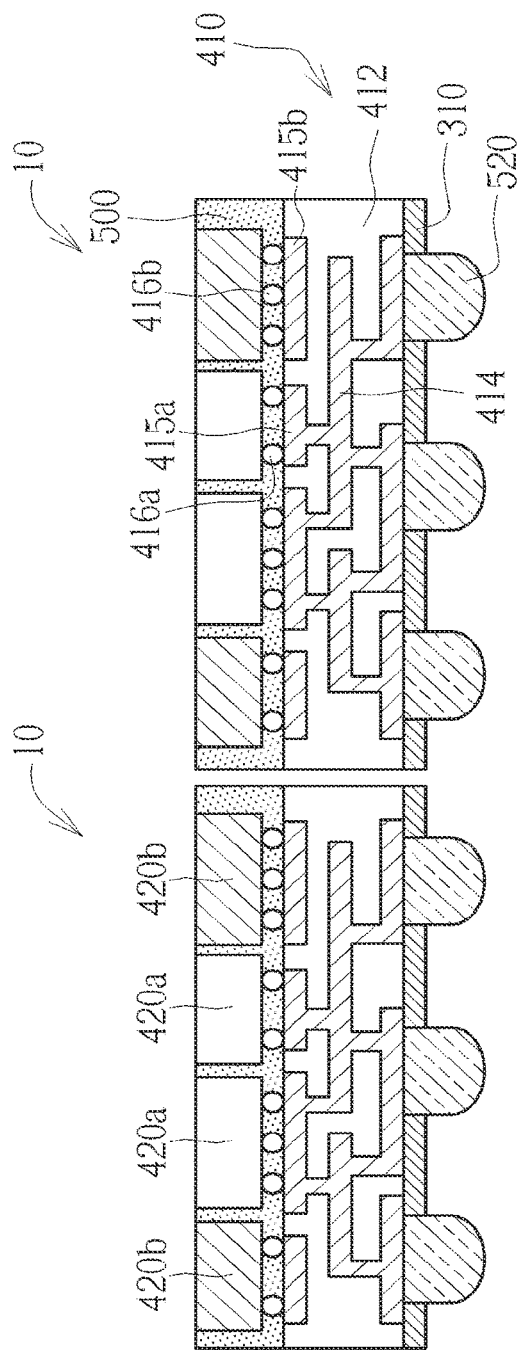

Thereafter, as shown in FIG. 7, a dicing process is performed to separate individual wafer-level packages 10 from one another.

With reference to FIGS. 9 through 13, depicted are schematic diagrams showing an exemplary method for fabricating a wafer-level package (WLP) with a substrate-less (or TSV-less) interposer according to another embodiment of the invention, wherein like numeral numbers designate like regions, layers or elements.

Figure 9:
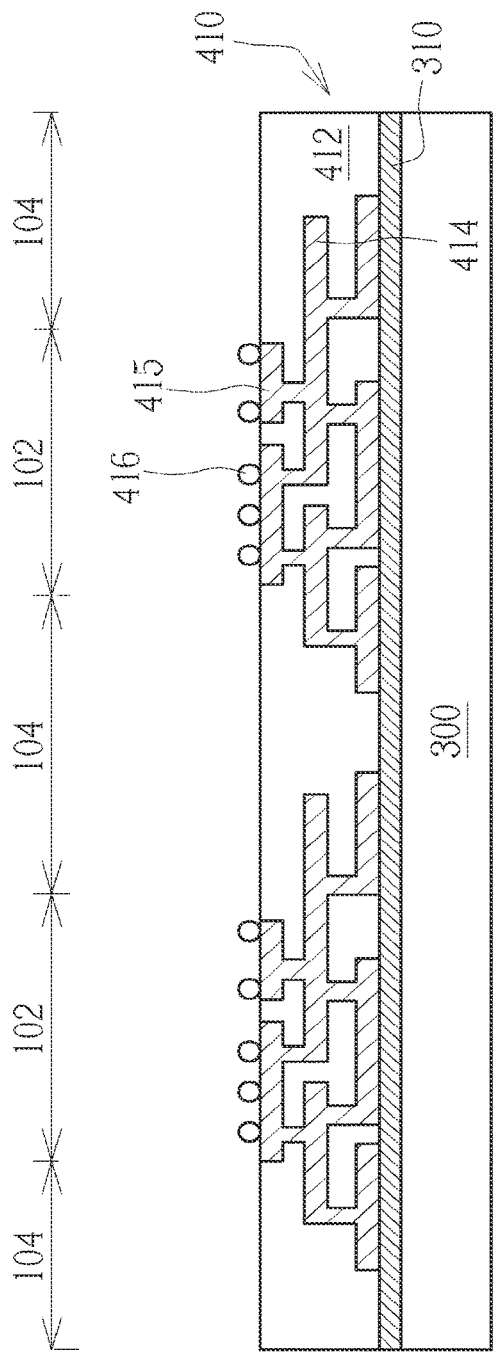
FIGS. 9 through 13 are schematic diagrams showing an exemplary method for fabricating a WLP with a substrate-less interposer according to another embodiment of the invention.

As shown in FIG. 9, likewise, a redistribution layer (RDL) 410 is formed on the passivation layer 310. The RDL 410 may comprise at least one dielectric layer 412 and at least one metal layer 414. The dielectric layer 412 may comprise organic materials such as polyimide (PI) or inorganic materials such as silicon nitride, silicon oxide, or the like, but not limited thereto. The metal layer 414 may comprise aluminum, copper, tungsten, titanium, titanium nitride, or the like.

According to the illustrated embodiment of FIG. 9, the metal layer 414 may comprise a plurality of bump pads 415 exposed from a top surface of the dielectric layer 412. The bump pads 415 are disposed within a chip mounting area 102. In general, no bump pads are formed within a peripheral area 104 around the chip mounting area 102. A plurality of bumps 416, such as micro-bumps, may be formed on the RDL 410 for further connections. The bumps 416 may be directly formed on respective bump pads 415 in the metal layer 414.

Figure 10:
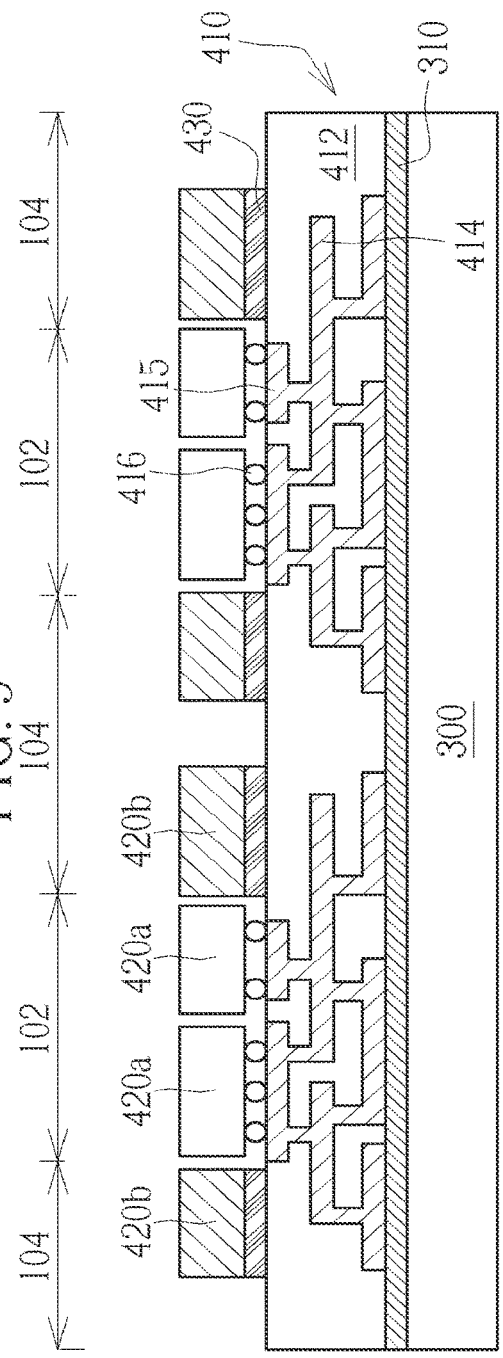

As shown in FIG. 10, after the formation of the bumps 416, individual flip-chips or dies 420a with their active sides facing down toward the RDL 410 are then mounted on the RDL 410 through the bumps 416, thereby forming a stacked chip-to-wafer (C2W) construction. Optionally, an underfill (not shown) may be applied under each active chip 420a. Thereafter, a thermal process may be performed to reflow the bumps 416.

According to the illustrated embodiment, dummy chips 420b are mounted on the dielectric layer 412 of the RDL 410 within the peripheral area 104 around the chip mounting area 102 by using an adhesive 430.

Figure 11:
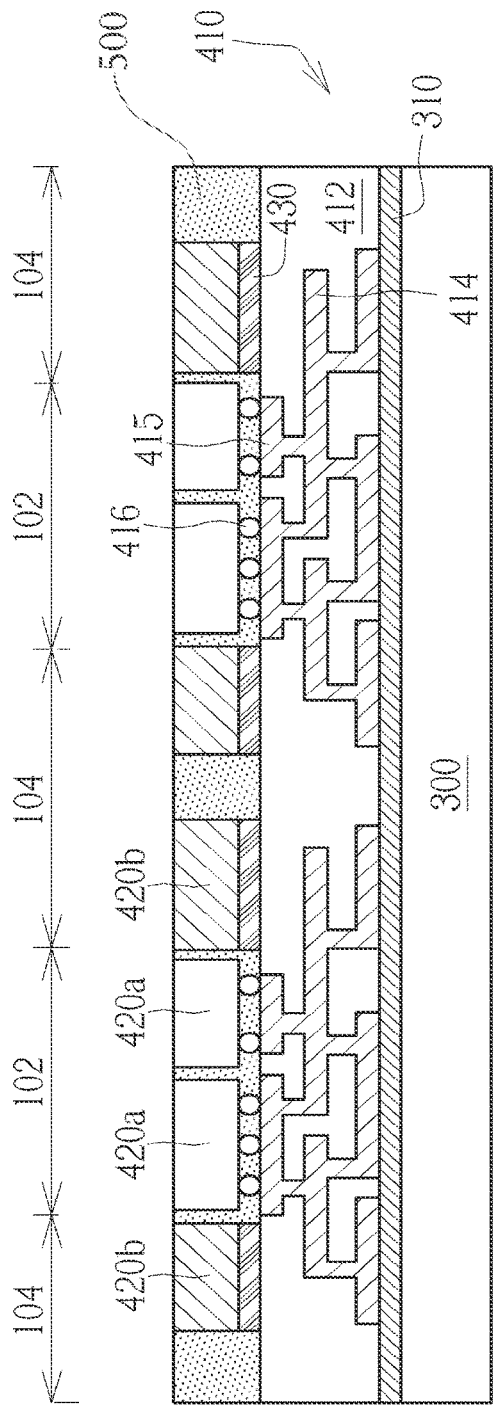

As shown in FIG. 11, after the die-bonding process, a molding compound 500 is applied. The molding compound 500 covers the attached active chips 420a and the dummy chips 420b and the exposed top surface of the RDL 410. The molding compound 500 may be subjected to a curing process. Optionally, a top portion of the molding compound 500 may be polished away to expose top surfaces of the active chips 420a and the dummy chips 420b.

Figure 12:
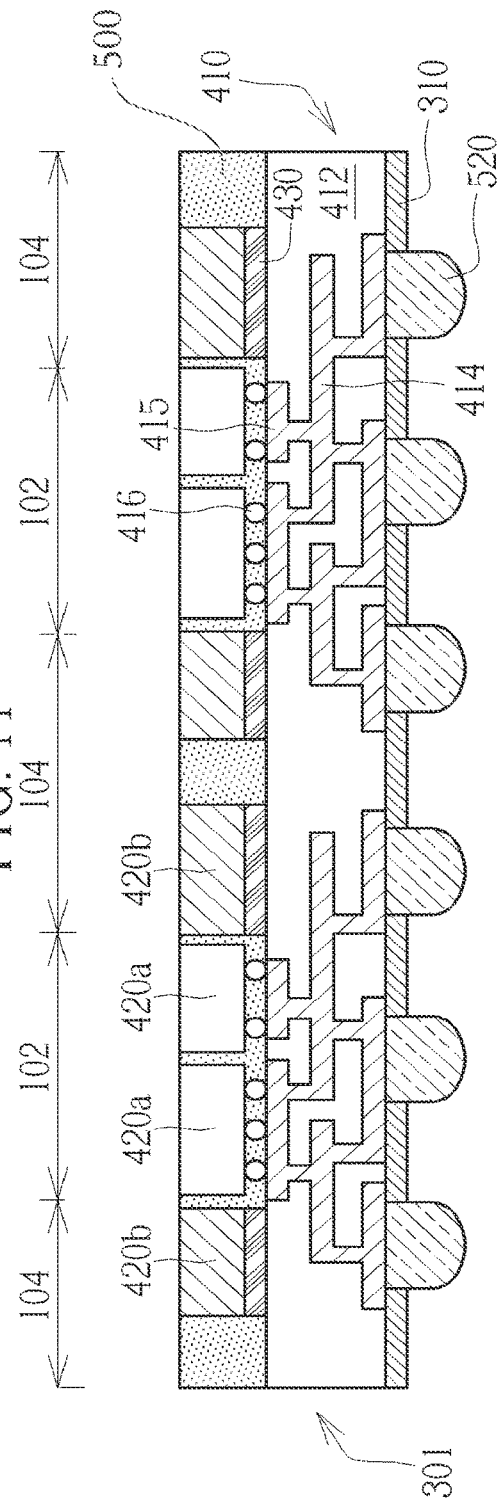

As shown in FIG. 12, after the formation of the molding compound 500, the carrier 300 is removed or peeled off to expose the passivation layer 310, thereby forming a TSV-less interposer 301. The de-bonding of the carrier 300 may be performed by using a laser process or UV irradiation process, but is not limited thereto.

To peel off the carrier 300, another temporary carrier substrate (not shown) may be attached to the molding compound 500. After the de-bonding of the carrier 300, openings may be formed in the passivation layer 310 to expose respective solder pads, and then solder bumps or solder balls 520 maybe formed on the respective solder pads. The temporary carrier substrate is then removed.

Figure 13:
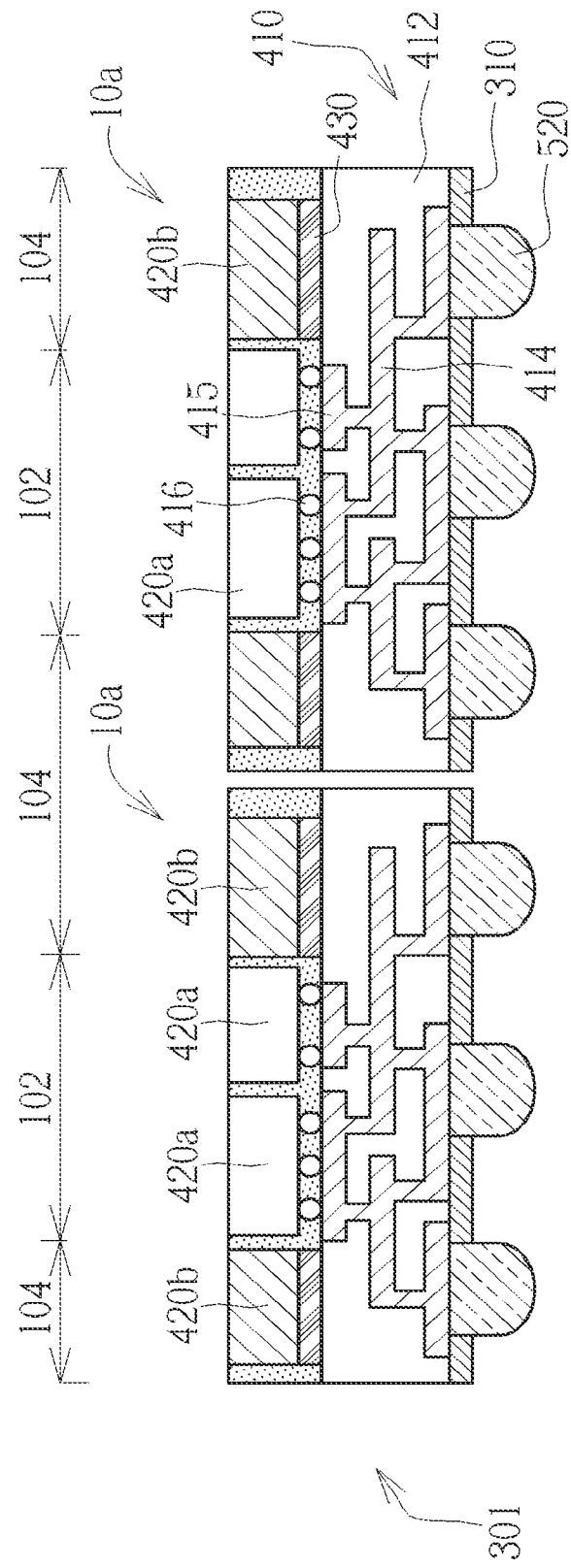

Thereafter, as shown in FIG. 13, a dicing process is performed to separate individual wafer-level packages 10a from one another.

Those skilled in the art will readily observe that numerous modifications and alterations of the devices and methods may be made while retaining the teachings of the invention. Accordingly, the above disclosure should be construed as limited only by the metes and bounds of the appended claims.

What is claimed is:

1. An apparatus, comprising:
   a redistribution layer;
   at least one active die mounted on the redistribution layer within a die mounting area;
   at least one dummy die mounted on the redistribution layer within a peripheral area located adjacent to and at least partially surrounding the die mounting area; and
   at least one electrically isolated, inactive dummy pad located outside the die mounting area and within the peripheral area, the at least one dummy die mounted on a single respective electrically isolated, inactive dummy pad.

2. The apparatus of claim 1, wherein the at least one active die comprises a memory die, an active surface of the memory die facing the redistribution layer and connected to an active bump pad of the redistribution layer with microbumps.

3. The apparatus of claim 1, wherein the at least one dummy die comprises a dummy silicon die having a size similar to that of the at least one active die.

4. The apparatus of claim 1, wherein the peripheral area is located proximate outer edges of individual packages, the die mounting area separated from the outer edges of the individual packages by the peripheral area.

5. The apparatus of claim 1, wherein the peripheral area is entirely devoid of the at least one active die.

6. The apparatus of claim 1, further comprising a molding compound over the redistribution layer and separating the at least one active die from the at least one dummy die.

7. The apparatus of claim 1, further comprising solder bumps located on a side of the redistribution layer opposite the at least one active die, at least some of the solder bumps in vertical alignment with one or more of the at least one active die and the at least one dummy die.

8. The apparatus of claim 7, wherein the solder bumps are operatively connected to the at least one active die only through the redistribution layer.

9. An apparatus, comprising:
   a redistribution layer comprising at least one active bump pad and at least one electrically isolated dummy pad;
   at least one active die mounted on a respective active bump pad, the at least one active die operatively connected to circuitry of the redistribution layer; and
   at least one dummy die mounted on a respective one of the at least one electrically isolated dummy pad, the at least one dummy die located entirely within a peripheral area laterally adjacent to and at least partially surrounding the at least one active die.

10. The apparatus of claim 9, wherein the at least one dummy die is located at an elevational level of the at least one active die, the at least one dummy die electrically isolated from the circuitry of the redistribution layer.

11. The apparatus of claim 9, wherein the at least one active die comprises two or more active dies and the at least one dummy die comprises two or more dummy dies, each of the two or more active dies and the two or more dummy dies laterally separated from one another by a molding compound.

12. The apparatus of claim 9, wherein the redistribution layer comprises metal segments within a dielectric material, outermost metal segments are configured as the at least one active bump pad and the at least one electrically isolated dummy pad.

13. The apparatus of claim 12, wherein the at least one electrically isolated dummy pad is in vertical alignment with at least some of the metal segments of the redistribution layer without being operatively connected thereto.

14. An apparatus, comprising:
   a redistribution layer comprising a dielectric material and metal segments within the dielectric material;
   at least one active die connected to a first portion of the metal segments, the at least one active die centrally located on a major surface of the redistribution layer; and
   at least one dummy die connected to a second portion of the metal segments, the at least one dummy die located within an outer region adjacent to and laterally surrounding the at least one active die on at least two sides, wherein individual metal segments of the second portion are each connected to a respective different one of the at least one dummy die, the dielectric material electrically isolating the metal segments of the second portion from circuitry of the redistribution layer.

15. The apparatus of claim 14, further comprising:
   a passivation material on a side of the redistribution layer opposite the major surface; and
   solder bumps extending though the passivation material, the solder bumps operatively connected to the at least one active die directly through the circuitry of the redistribution layer.

16. The apparatus of claim 15, wherein the metal segments of the first portion are located directly between the at least one active die and the solder bumps.

17. The apparatus of claim 14, wherein at least some of the metal segments of the first portion are configured as conductive bump pads for the at least one active die and at least some of the metal segments of the second portion are configured as electrically isolated bump pads for the at least one dummy die.

18. The apparatus of claim 14, wherein the metal segments of the first portion are laterally separated from the metal segments of the second portion by the dielectric material.

19. The apparatus of claim 14, wherein an outer surface of the dielectric material on the major surface of the redistribution layer is substantially coplanar with outer surfaces of the metal segments of the first portion and the metal segments of the second portion.

20. The apparatus of claim 14, wherein the major surface of the redistribution layer comprises a central region fully laterally surrounded on all sides by the outer region, the at least one active die located within the central region and the at least one dummy die located within the outer region without being located within the central region.

\* \* \* \* \*